United States Patent
Xu

(10) Patent No.: US 11,163,364 B2
(45) Date of Patent: Nov. 2, 2021

(54) TOUCH CONTROL SUBSTRATE, TOUCH SCREEN, ELECTRONIC DEVICE AND TOUCH CONTROL METHOD

(71) Applicant: BOE Technology Group Co., Ltd., Beijing (CN)

(72) Inventor: Rui Xu, Beijing (CN)

(73) Assignee: BOE TECHNOLOGY GROUP CO., LTD., Beijing (CN)

(\*) Notice: Subject to any disclaimer, the term of this patent is extended or adjusted under 35 U.S.C. 154(b) by 0 days.

(21) Appl. No.: 16/340,796

(22) PCT Filed: Jun. 28, 2018

(86) PCT No.: PCT/CN2018/093237
§ 371 (c)(1),
(2) Date: Apr. 10, 2019

(87) PCT Pub. No.: WO2019/041999
PCT Pub. Date: Mar. 7, 2019

(65) Prior Publication Data
US 2020/0050271 A1    Feb. 13, 2020

(30) Foreign Application Priority Data
Aug. 30, 2017    (CN) .......................... 201710766153.0

(51) Int. Cl.
*G06F 3/01*     (2006.01)
*G02F 1/1335*   (2006.01)
(Continued)

(52) U.S. Cl.
CPC ........ *G06F 3/016* (2013.01); *G02F 1/133528* (2013.01); *G06F 3/0412* (2013.01);
(Continued)

(58) Field of Classification Search
CPC ...... G06F 3/016; G06F 3/0412; G06F 3/0416; G06F 3/044; G02F 1/133528;
(Continued)

(56) References Cited

U.S. PATENT DOCUMENTS 7,446,456 B2 \* 11/2008 Maruyama .......... H01L 41/0825
310/328
8,743,300 B2 \* 6/2014 Chang ............... G02F 1/133514
349/12
(Continued)

FOREIGN PATENT DOCUMENTS

CN    101464727 A    6/2009
CN    104834104 A    8/2015
(Continued)

OTHER PUBLICATIONS

International Search Report (including English translation) and Written Opinion of PCT/CN2018/093237, dated Sep. 30, 2018.
(Continued)

*Primary Examiner* — Grant Sitta
(74) *Attorney, Agent, or Firm* — Fay Sharpe LLP

(57) ABSTRACT

The present disclosure provides a touch control substrate, a touch screen, an electronic device, and a touch control method. The touch control substrate comprises a base substrate, and a plurality of touch control units on the base substrate in an array; each touch control unit comprises a touch control electrode and a sensing structure electrically connected to the touch control electrode; and in response to being touched, the touch control electrode transmits voltage to the sensing structure, to cause tactility change of the sensing structure.

14 Claims, 8 Drawing Sheets

(51) Int. Cl.
*G06F 3/041* (2006.01)
*H01L 27/32* (2006.01)
*G06F 3/044* (2006.01)

(52) U.S. Cl.
CPC .......... *G06F 3/0443* (2019.05); *H01L 27/323* (2013.01); *H01L 27/3232* (2013.01); *G02F 2201/121* (2013.01); *G02F 2201/123* (2013.01); *G02F 2201/44* (2013.01); *G02F 2203/30* (2013.01)

(58) Field of Classification Search
CPC ......... G02F 2201/121; G02F 2201/123; G02F 2201/44; G02F 2203/30; H01L 27/323; H01L 27/3232
See application file for complete search history.

(56) References Cited

U.S. PATENT DOCUMENTS

| | | | |
|---|---|---|---|
| 9,244,531 | B2 | 1/2016 | Takashima et al. |
| 9,904,365 | B2* | 2/2018 | Son ........................ G06F 3/016 |
| 10,416,771 | B2* | 9/2019 | Warren ................... G06F 3/016 |
| 2010/0085169 | A1* | 4/2010 | Poupyrev ............ G06F 3/03543 340/407.2 |
| 2012/0268412 | A1* | 10/2012 | Cruz-Hernandez ..... G06F 3/016 345/174 |
| 2013/0057509 | A1* | 3/2013 | Cruz-Hernandez .......................... G06F 3/04166 345/174 |
| 2013/0106774 | A1* | 5/2013 | Radivojevic ............ G06F 3/016 345/174 |
| 2014/0028933 | A1* | 1/2014 | Chen .................... H04N 13/305 349/15 |
| 2017/0139218 | A1 | 5/2017 | Lu et al. |
| 2017/0192507 | A1* | 7/2017 | Lee ........................ G06F 3/016 |
| 2017/0235023 | A1* | 8/2017 | Mita ................. G02F 1/133528 428/354 |
| 2018/0052550 | A1 | 2/2018 | Zhang et al. |

FOREIGN PATENT DOCUMENTS

| | | |
|---|---|---|
| CN | 105739762 A | 7/2016 |
| CN | 106652877 A | 5/2017 |
| CN | 107688416 A | 2/2018 |

OTHER PUBLICATIONS

First Office Action of the priority Chinese application No. 201710766153.0 dated Mar. 26, 2019.

* cited by examiner

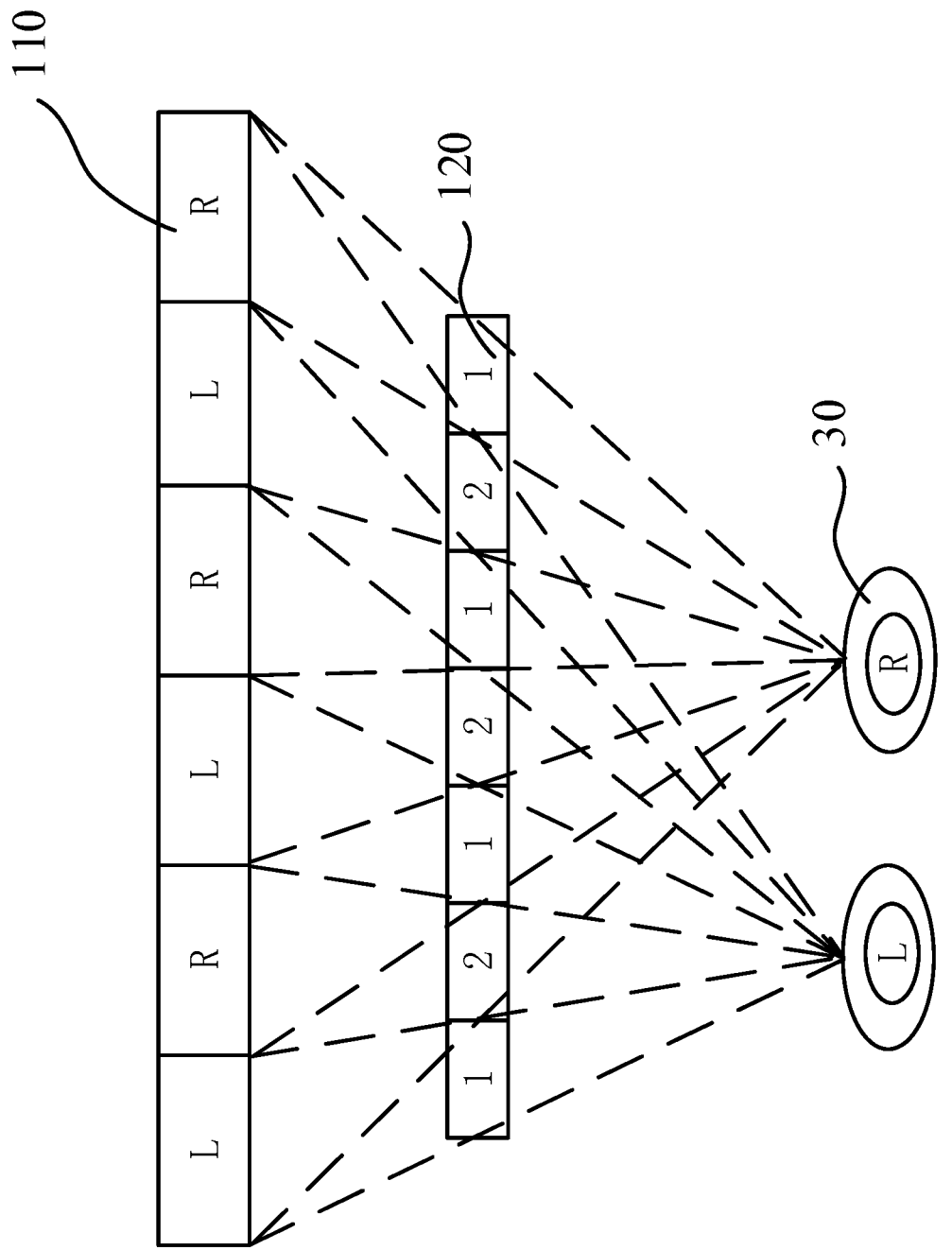

TOUCH CONTROL SUBSTRATE, TOUCH SCREEN, ELECTRONIC DEVICE AND TOUCH CONTROL METHOD

CROSS-REFERENCE TO RELATED APPLICATION

This application is a 371 of PCT Patent Application Serial No. PCT/CN2018/093237, filed on Jun. 28, 2018, which claims priority to Chinese Patent Application No. 201710766153.0, filed on Aug. 30, 2017 and entitled "TOUCH CONTROL SUBSTRATE, TOUCH SCREEN, ELECTRONIC DEVICE AND TOUCH CONTROL METHOD", the entire contents of which are incorporated herein by reference.

TECHNICAL FIELD

The present disclosure relates to a touch control substrate, a touch screen, an electronic device, and a touch control method.

BACKGROUND

With the development of display technologies, touch screens have replaced traditional keyboards as main input units of smart terminal devices. When a user uses the smart terminal device, an input function can be achieved by clicking the touch screen.

SUMMARY

The present disclosure provides a touch control substrate, a touch screen, an electronic device, and a touch control method.

At least one embodiment of the present disclosure provides a touch control substrate, comprising: a base substrate, and a plurality of touch control units arranged on the base substrate in an array, wherein each touch control unit comprises a touch control electrode and a sensing, the touch control electrode loads a first driving signal and generates a feedback signal under the exertion of the first driving signal; and the sensing structure is configured to load a second driving signal if a feedback signal generated by the touch control electrode in the same touch control unit meets a first requirement, wherein the second driving signal is used to drive tactility change of the sensing structure.

In an implementation of the embodiments of the present disclosure, the touch control electrode is electrically connected to the sensing structure and configured to provide the second driving signal if the feedback signal generated meets the first requirement.

In an implementation of the embodiments of the present disclosure, a hole exists at a side of the sensing structure backing to the base substrate, and the touch control electrode in each touch control unit is in the hole of the corresponding sensing structure.

In an implementation of the embodiments of the present disclosure, the tactility change of the sensing structure comprises one of the following two cases: a hardness change, and a thickness change in a direction perpendicular to the base substrate.

In an implementation of the embodiments of the present disclosure, the sensing structure is made of an N-isopropyl acrylamide material and the hardness of the sensing structure changes under the exertion of voltage.

In an implementation of the embodiments of the present disclosure, the sensing structure is made of an electrostrictive material and the thickness of the sensing structure in a direction perpendicular to the base substrate changes under the exertion of voltage.

At least one embodiment of the present disclosure provides a touch screen, comprising a display screen and a touch control substrate on the display screen, wherein the touch control substrate comprises a base substrate, and a plurality of touch control units arranged on the base substrate in an array; each touch control unit comprises a touch control electrode and a sensing structure the touch control electrode loads a first driving signal and generates a feedback signal under the exertion of the first driving signal; and the sensing structure is configured to load a second driving signal if a feedback signal generated by the touch control electrode in the same touch control unit meets a first requirement, wherein the second driving signal is used to drive tactility change of the sensing structure.

In an implementation of the embodiments of the present disclosure, the touch control electrode is electrically connected to the sensing structure and configured to provide the second driving signal if the feedback signal generated meets the first requirement.

In an implementation of the embodiments of the present disclosure, a hole exists at a side of the sensing structure backing to the base substrate, and the touch control electrode in each touch control unit is arranged in the hole of the corresponding sensing structure.

In an implementation of the embodiments of the present disclosure, the tactility change of the sensing structure comprises one of the following two cases: a hardness change, and a thickness change in a direction perpendicular to the base substrate.

In an implementation of the embodiments of the present disclosure, the sensing structure is made of an N-isopropyl acrylamide material and the hardness of the sensing structure changes under the exertion of voltage.

In an implementation of the embodiments of the present disclosure, the sensing structure is made of an electrostrictive material, and the thickness of the sensing structure in a direction perpendicular to the base substrate changes under the exertion of voltage.

In an implementation of the embodiments of the present disclosure, the display screen comprises a display panel, a liquid crystal grating on display panel, and a control apparatus for controlling the operation of the display panel and the liquid crystal grating; wherein the control apparatus is configured to control the display panel to generate an image and control the deflection of a liquid crystal in the liquid crystal grating.

In an implementation of the embodiments of the present disclosure, the liquid crystal grating comprises an array substrate with a pixel electrode, a cover plate with a common electrode, a liquid crystal between the array substrate and the cover plate, and a lower polarizer on a light incident side of the array substrate; and the array substrate is at a light-emitting side of the display panel.

In an implementation of the embodiments of the present disclosure, the cover plate is reused as a base substrate of the touch control substrate, and the plurality of touch control units is on a side of the cover plate facing the array substrate.

In an implementation of the embodiments of the present disclosure, the thickness of the cover plate is 50-100 μm.

In an implementation of the embodiments of the present disclosure, the touch control electrodes in the plurality of touch control units are reused as the common electrodes.

In an implementation of the embodiments of the present disclosure, the touch control substrate is on a side of the cover plate backing to the array substrate and the cover plate is reused as the base substrate of the touch control substrate.

In an implementation of the embodiments of the present disclosure, a transparent encapsulating layer is on the touch control substrate.

In an implementation of the embodiments of the present disclosure, the control device is configured to control the display panel to work in a set gray-scale, and control the deflection of a liquid crystal in the liquid crystal grating so as to control the gray-scale of each pixel in the display screen.

In an implementation of the embodiments of the present disclosure, the display panel is an organic light-emitting diode panel.

At least one embodiment of the present disclosure provides an electronic device, comprising any one of the touch screens in the second aspect.

At least one embodiment of the present disclosure provides a touch control method implemented based on any one of foregoing the touch screens. The method comprises: loading a first driving signal to a touch control electrode in each touch control unit; receiving a feedback signal of the touch control electrode in each touch control unit; and loading a second driving signal to the sensing structure in the touch control unit which outputs the feedback signal meeting a first requirement, wherein the second driving signal is used to drive tactility change of the sensing structure in the touched touch control unit.

In an implementation of the embodiments of the present disclosure, the method further comprises: in a display stage, loading a common electrode driving signal to the touch control electrode in each touch control unit.

In an implementation of the embodiments of the present disclosure, the first driving signal is a pulse signal whose peak voltage is 3-5V.

In an implementation of the embodiments of the present disclosure, voltage of the second driving signal is 5-15V.

BRIEF DESCRIPTION OF THE DRAWINGS

FIG. 5b is a schematic view of three-dimensional imaging of the display screen according to the embodiment of the present disclosure;

DETAILED DESCRIPTION

The embodiments of the present disclosure will be described in further detail with reference to the accompanying drawings, to more clearly present the principles and advantages of the present disclosure.

Although the existing touch screen can meet input requirements of the user, the user has relatively poor hand-feel when using the touch screen for input as the touch screen has a planar structure.

Figure 1:
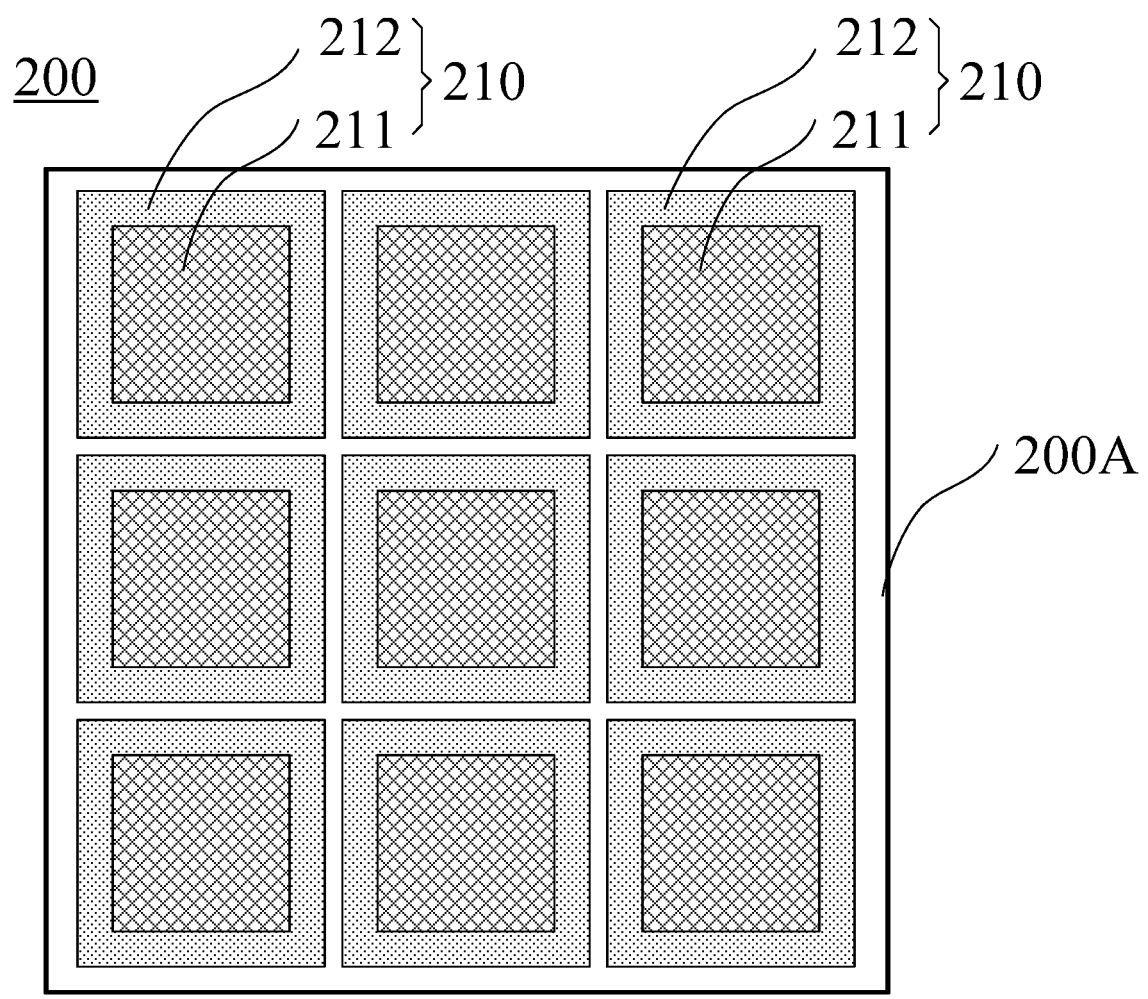
FIG. 1 is a schematically structural view of a touch control substrate provided by an embodiment of the present disclosure.

FIG. 1 is a schematically structural view of a touch control substrate 200 provided by an embodiment of the present disclosure. Referring to FIG. 1, the touch control substrate 200 comprises a base substrate 200A and a plurality of touch control units 210 arranged on the base substrate 200A in an array. Each touch control unit 210 includes a touch control electrode 211 and a sensing structure 212. Exemplarily, the control electrode 211 loads a first driving signal and generates a feedback signal under the exertion of the first driving signal. The sensing structure is configured to load a second driving signal if a feedback signal generated by the touch control electrode 211 in the same touch control unit 210 meets a first requirement. The second driving signal is used to drive tactility change of the sensing structure. Here, the first requirement may be that the voltage of the feedback signal is within a voltage range.

Exemplarily, the sensing structure 212 in each touch control unit 210 is electrically connected to the touch control electrode 211. Responding to being touched, the touch control electrode 211 transmits voltage to the sensing structure 212, to cause tactility change of the sensing structure 212. For example, the touch control electrode 211 is configured to provide a second driving signal required by the sensing structure 212 if the feedback signal generated meets the first requirement. Thus, it only needs to arrange signal lines for the touch control electrode and does not need to arrange signal lines for the sensing structure, which can save signal lines.

Here, a tactility change of the sensing structure 212 includes a hardness change or a thickness change. The hardness change of the sensing structure 212 means that the hardness of the sensing structure 212 changes under the same hardness measurement standard, wherein the hardness refers to a degree of softness and hardness. The thickness change of the sensing structure 212 means that the sensing structure 212 is shrunk or stretched in a direction perpendicular to the base substrate 200A.

In the embodiment of the present disclosure, the touch control substrate 200 includes the touch control electrode 211 and the sensing structure 212. The hardness or thickness of the sensing structure 212 changes when the touch control unit 210 is touched by a user, so that the user can feel the change in the hardness or thickness of a button when he/she touches the button. This change in hardness or thickness gives richer tactile sense to the user when user presses the button compared with a common touch control screen, so that the user's input hand-feel is improved. Here, pressing the button may refer to pressing the virtual button on the touch screen, or pressing any controllable region on the touch screen.

As shown in FIG. 1, in an implementation of the embodiment of the present disclosure, a hole is set in the middle of the sensing structure 212. The touch control electrode 211 in each touch control unit 210 is arranged in the hole of the corresponding sensing structure 212. That is, the hole in which the touch control electrode 211 is arranged is opened in the middle of a side of each touch control unit 210 provided to be touched by the user; and the sensing structure 212 is arranged around the corresponding touch control electrode 211. The touch control electrode 211 is arranged in the hole in the middle of the sensing structure 212, so that when the user presses the touch control unit 210, he/she can press the sensing structure 212 and the touch control electrode 211 simultaneously. Thus, not only is a touch control signal generated through the touch control electrode 211, but also the user can feel the hardness or thickness change of the sensing structure 212, thereby guaranteeing the user's touch control experience. Exemplarily, the foregoing hole is disposed at the side of the sensing structure 212 backing to the base substrate 200A, such that the touch control electrode 211 may be exposed from the sensing structure 212, thereby Guaranteeing the touch control effect of the touch control electrode 211.

Alternatively, the sensing structure 212 may be a rectangular frame, a circular frame, or the like. Correspondingly, the touch control electrode 211 may be rectangular, cylindrical, or the like.

In the embodiment of the present disclosure, the shapes and the sizes of the plurality of sensing structures 212 may be the same, so are the shapes and the sizes of the plurality of touch control electrodes 211, for the convenience of the arrangement and the fabrication of the sensing structure 212 and the touch control electrode 211. Here, the area of the sensing structure 212 or the touch control electrode 211 refers to the area of a side of the sensing structure 212 or the touch control electrode 211 provided to the user to touch, namely, a projected area of the sensing structure 212 or the touch control electrode 211 on the base substrate 200A. In other embodiments, the areas of the plurality of sensing structures 212 may be different, so are the areas of the plurality of touch control electrodes 211, which are not limited in the present disclosure.

Alternatively, the hole in the middle of the sensing structure 212 may be a through hole or a blind hole. For example, if the hole is a through hole, the entire touch control unit 210 can be thinner. The shape and the size of the hole can be the same as those of the touch control electrode 211, so that the touch control electrode 211 can be fixed in the hole in the middle of the sensing structure 212.

In other implementations of the embodiments of the present disclosure, the sensing structure 212 may also be arranged in other manners. For example, both the touch control electrode 211 and the sensing structure 212 are rectangular and arranged side by side to form the touch control unit.

In the embodiment of the present disclosure, in each touch control unit 210, the sensing structure 212 is electrically connected to the touch control electrode 211. When the touch control electrode 211 is touched, the touch control electrode 211 is configured to transmit a voltage to the sensing structure 212 which is electrically connected thereto. The hardness of the sensing structure 212 changes under the exertion of the voltage, or the thickness of the sensing structure 212 in a direction perpendicular to the base substrate changes under the exertion of the voltage. The voltage transmitted by the touch control electrode 211 is provided by a control unit connected thereto. The hardness or thickness of the sensing structure 212 changes by the voltage provided by the touch control electrode 211, so that when the user presses the touch control electrode 211, he/she can feel the change of the sensing structure 212 via tactile sense, thereby having a feeling of pressing a real button.

When the touch control electrode 211 is not touched, the touch control electrode 211 does not supply voltage to the sensing structure 212 electrically connected thereto, so that the sensing structure 212 is not powered and the hardness or thickness does not change.

As shown in FIG. 1, as the touch control electrode 211 is embedded in the hole in the middle of the sensing structure 212, the touch control electrode 211 and the sensing structure 212 are electrically connected to each other. If in another implementation, for example, that the touch control electrode 211 and the sensing structure 212 are arranged side by side, it only needs to set them to be closely adhered to each other.

In the embodiment of the present disclosure, the touch control substrate further includes a control unit. The control unit is used to detect a capacitance change between the touch control electrode 211 and a user's finger and determine a touch position of the user's finger accordingly. In addition, the control unit is further configured to supply voltage to the corresponding touch control electrode 211 when determining the touch position, so that the generated voltage is transmitted to the sensing structure. Taking the sensing structure for the hardness changes as an example, when the user touches the touch control electrode, the control unit detects the capacitance change. Thus, when the touch control electrode 211 is powered, the temperature of the sensing structure 212 electrically connected to the touch control electrode 211 increases with the power supplied, so that the sensing structure changes from soft to hard. This provides a touch effect of pressing a button to the user, thereby realizing a three-dimensional effect and pressure feeling when pressing the button. When the touch control electrode 211 is no longer touched, the touch control electrode 211 does not supply voltage to the corresponding touch control electrode 211 any longer, the touch control electrode 211 is powered off, and the sensing structure 212 is also powered off. The temperature of the sensing structure 212 decreases, so that the hardness is gradually decreased and the sensing structure 212 returns to a softer state.

It is easy to know that in order to achieve the above function, the control unit on the touch control substrate is electrically connected to the touch control electrode 211 in each touch control unit. Exemplarily, each touch control unit is led to the control unit through a signal line to achieve a touch control function. The control unit may be implemented by using an integrated circuit (IC).

In an implementation of the embodiment of the present disclosure, when the touch control unit 210 is touched by the user, the hardness of the sensing structure 212 in the touch control unit 210 changes, including from soft to hard and from hard to soft. From soft to hard means that the hardness of the untouched sensing structure 212 is less than that of the touched sensing structure 212. From hard to soft means that the hardness of the touched sensing structure 212 is less than that of the untouched sensing structure 212.

Figure 2:
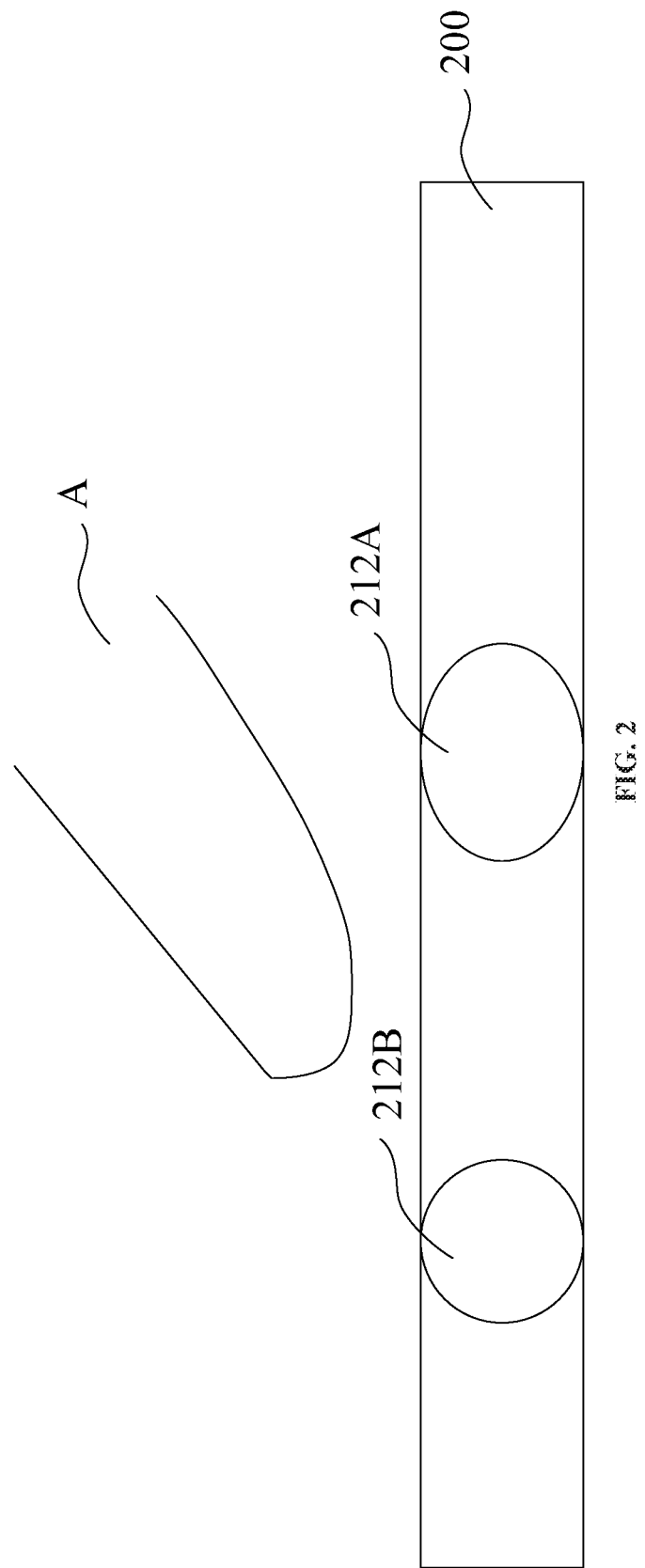
FIG. 2 is a schematic view showing a hardness change of a sensing structure according to an embodiment of the present disclosure.

FIG. 2 is a schematic view showing a hardness change of a sensing structure according to an embodiment of the present disclosure. Referring to FIG. 2, when the user's finger touches the touch control substrate 200, the hardness of the untouched sensing structure 212 in the touch sensing substrate 200 does not change and the shape of the sensing structure 212 is an initial state as shown in reference numeral 212B. The touched sensing structure 212 is deformed under a pressure (the sensing structure is softer when not being powered). Meanwhile, the touched sensing structure 212 is powered during the touch process and changes from soft to hard; and the shape of the sensing structure 212 does not change further as shown in reference numeral 212A. It should be noted that the shape of the sensing structure shown in FIG. 2 is only used to describe the change in hardness and is not intended to limit the sensing structure.

In the embodiment of the present disclosure, the sensing structure 212 may be made of a temperature-sensing gel which is a polymeric polymer material. The temperature of the temperature-sensing gel increases under the exertion of the voltage exerted by the touch control electrode 211, so that the sensing structure changes from soft and hard.

Exemplarily, the sensing structure 212 is made of an N-isopropyl acrylamide material and the hardness of the sensing structure 212 changes under the exertion of a voltage. The function of the hardness change of the sensing structure 212 can be achieved by using the material.

In another implementation of the embodiment of the present disclosure, the sensing structure 212 is made of an electrostrictive material and the thickness of the sensing structure 212 in a direction perpendicular to the base substrate 200A changes under the exertion of the voltage. In this implementation, the stretching and shrinking direction of the electrostrictive material is perpendicular to the base substrate. For example, the sensing structure 212 is a piezoelectric ceramic. Two electrodes are arranged at the two ends of the piezoelectric ceramic, respectively; one electrode is arranged at the end of the piezoelectric ceramic close to the base substrate. The other electrode is arranged at the end of the piezoelectric ceramic away from the base substrate. The touch control electrode is arranged in the hole in the middle of the piezoelectric ceramic. Unlike the sensing structure made of the N-isopropyl acrylamide material, when the piezoelectric ceramic is used as the sensing structure, the touch control electrode is connected to one electrode on the piezoelectric ceramic and the other electrode of the piezoelectric ceramic can be grounded, so that the piezoelectric ceramic is powered through the touch control electrode when the touch control unit is touched, thereby causing the piezoelectric ceramic to generate a stretching and shrinking change.

Figure 3:
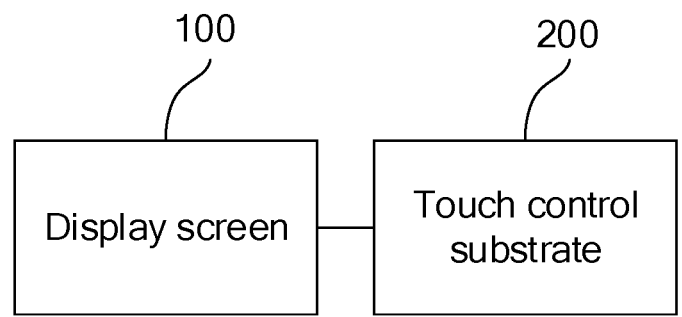
FIG. 3 is a schematically structural view of a touch screen according to an embodiment of the present disclosure.

FIG. 3 is a schematically structural view of a touch screen according to an embodiment of the present disclosure. Referring to FIG. 3, the touch screen includes a display screen 100 and a touch control substrate 200 arranged on the display screen 100. Here, the touch control substrate 200 is as described above.

In the embodiment of the present disclosure, the touch control substrate 200 is arranged on the display screen 100—inside the display screen 100 or outside of the display screen 100, referring the detailed structure below.

Figure 4:
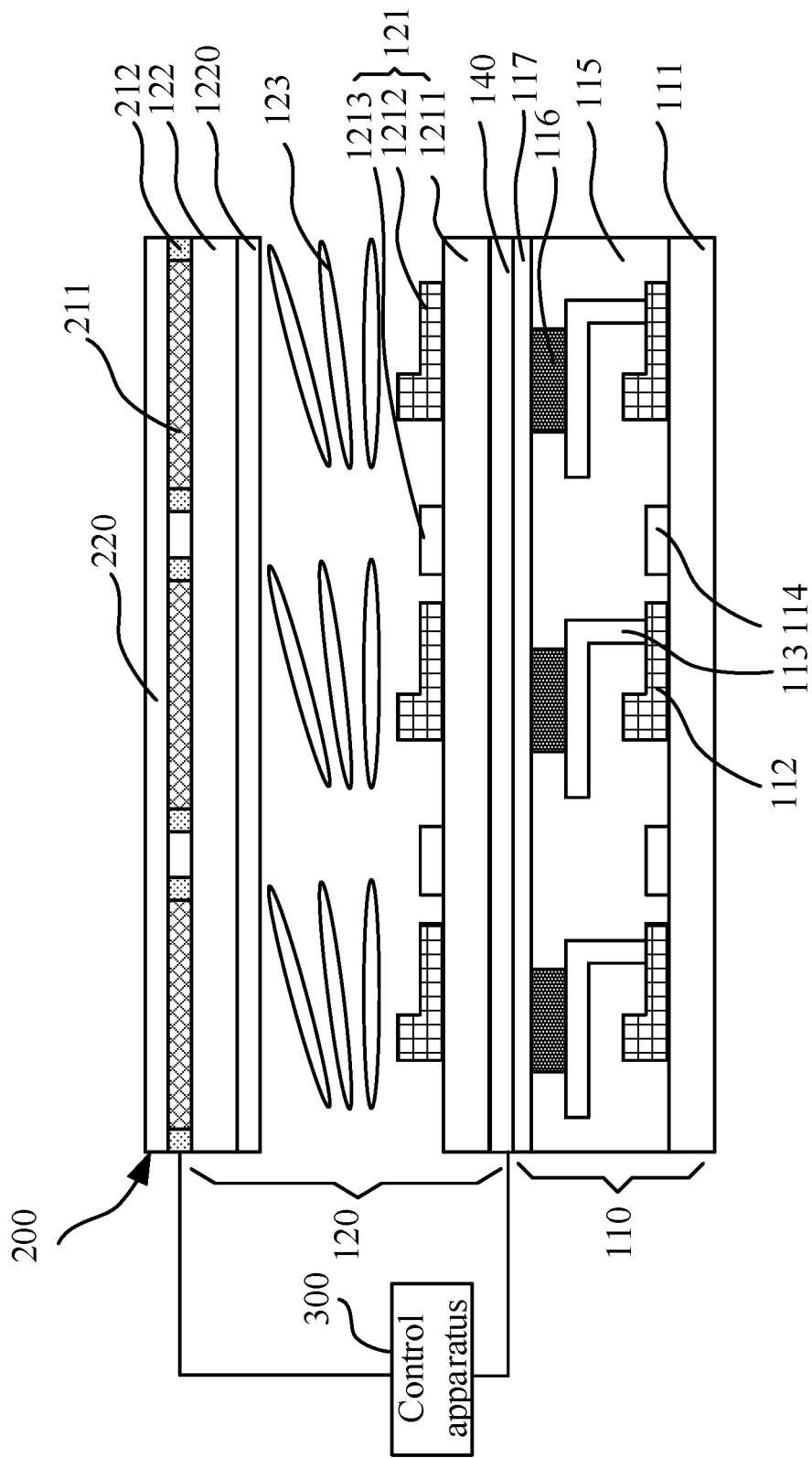
FIG. 4 is a schematically structural view of a display screen according to an embodiment of the present disclosure.

FIG. 4 is a schematically structural view of a display screen according to an embodiment of the present disclosure. Referring to FIG. 4, the display screen 100 includes a display panel 110, a liquid crystal grating 120 covering the display panel 110, and a control apparatus 300 for controlling the operation of the display panel 110 and the liquid crystal grating 120. The control apparatus 300 is electrically connected to the liquid crystal grating 120 and the display panel 110, respectively to control the liquid crystal grating 120 and the display panel 110.

The control apparatus 300 is configured to control the display panel 110 to generate an image and control a liquid crystal 123 in the liquid crystal grating 120 to be deflected, so that the user's both eyes can respectively see an image with the same pixel on the display panel 110 from different positions of the liquid crystal grating 120. As the images seen by the user's both eyes are different, a 3D effect is generated.

In the embodiment of the present disclosure, the display panel may be an OLED (Organic Light-Emitting Diode) panel.

Here, the control apparatus 300 may be implemented by using an IC.

The display screen 100 is implemented by the display panel 110 and the liquid crystal grating 120. The display panel 110 is responsible for generating an image; and the liquid crystal grating 120 is used as a three-dimensional display grating. By controlling the deflection of the liquid crystal in the liquid crystal grating, the user's eyes can see an image with the same pixel on the display panel 110 from different positions of the liquid crystal grating 120. In this way, a parallax image is formed, so that a 3D image is generated in the user's eyes. The display screen 100 having the 3D display function is used as a display portion of the touch screen. The touch screen can display a 3D keyboard interface during input. Compared with the traditional touch screen, the keyboard interface display is more stereoscopic and is closer to the traditional keyboard, so that a stereoscopic keyboard is achieved from both aspects of vision and touch, thereby improving the user's input experience. In this display screen 100, the liquid crystal grating 120 ensures that the image displayed by the display panel 110 finally presents a 3D effect. In addition, as the picture is implemented by the display panel 110, the resolution is higher. Therefore, the display screen with the above structure solves a problem that the liquid crystal display (LCD) has a low resolution when performing 3D display. Meanwhile, based on 3D, a pressure sensitive touch control in the display screen is formed and a touch sensing is generated in a direction perpendicular to a light-emitting surface of the display screen. When experiencing pressing a button, a 3D and touch sensing four-dimensional experience can be achieved.

Figure 5A:
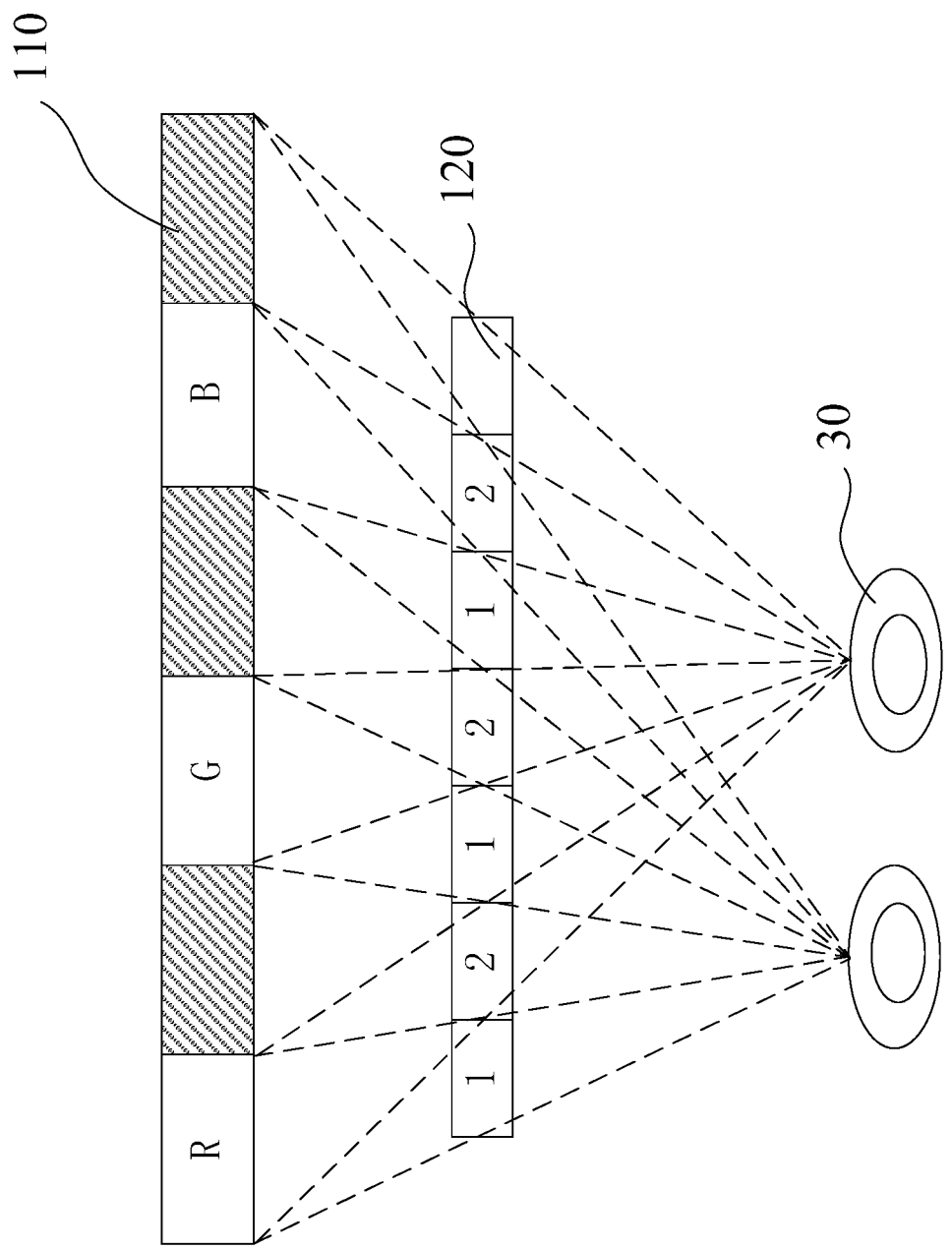
FIG. 5a is a schematic view of three-dimensional imaging of a display screen according to an embodiment of the present disclosure.

Exemplarily, FIG. 5a is a schematic view of three-dimensional imaging of a display screen according to an embodiment of the present disclosure. As shown in FIG. 5a, the user's one eye 30 can see images displayed by different pixel units on the display panel 110 through different positions of the liquid crystal grating. However, the user's two eyes 30 respectively see an image displayed by the same pixel on the display panel 110 from different positions of the liquid crystal grating 120 and the images with the same pixels and seen by the user's two eyes 30 are different. For example, in FIG. 5a, the user's left eye and the right eye see the R sub-pixel respectively through a first region 1 and a second region 2 of the liquid crystal grating, while the red color of the R sub-pixel is different in depth, so that a parallax image is formed when the user watches the images with the same pixel, thereby forming a 3D image in the user's eyes.

Exemplarily, in order to ensure that the user's two eyes can see the image displayed by the same pixel on the display panel 110 from different positions of the liquid crystal grating 120, liquid crystal deflection directions of the first region and the second region are different. As the different deflection directions form different gray scales, brightness of the light emitted by the same sub-pixel after the light passes through the first region and the second region are different. Thus, the user's left eye and the right eye see different images.

In addition, in order to prevent interference among RGB sub-pixels, a black matrix is arranged between adjacent two sub-pixels and is shown as a shaded portion (namely, a portion between the R sub-pixel and the G sub-pixel, and a portion between the G sub-pixel and the B sub-pixel) on the panel 110 in FIG. 5a. At this time, the liquid crystal grating 120 includes a lower polarizer located on the light incident side of an array substrate, and further includes an upper polarizer on the light-emitting side of a cover plate. In this way, the user can be provided with a naked-eye 3D effect without wearing 3D glasses.

Exemplarily, FIG. 5b is a schematic view of three-dimensional imaging of another display screen according to an embodiment of the present disclosure. As shown in FIG. 5b, driven by a control apparatus (for example, a driving IC), the liquid crystal grating 120 forms two alternate regions—a region 1 and a region 2. Light emitted by the display panel has the same polarization direction after passing through the lower polarizer on a light incident side of the array substrate. After passing through the region 1 and the region 2, it forms emitted lights whose polarization directions are perpendicular to each other. The display panel inputs a 3D image, and L and R correspond to a left eye image pixel and a right eye image pixel, respectively. When the user wears 3D glasses to watch images, a left eye image can only be received by the left lens of the glasses after passing through the region 1, and a right eye image can only be received by the right lens of the glasses after passing through the region 2 as two lenses of the 3D glasses are polarizers whose polarization directions are perpendicular to each other. Thus, the user's left eye and the right eye can see different images, which achieves 3D display.

Referring to FIG. 4 again, the liquid crystal grating 120 includes an array substrate 121 provided with pixel electrodes (not shown in the FIG.), a cover plate 122 provided with a common electrode 1220, a liquid crystal 123 arranged between the array substrate 121 and the cover plate 122, and a lower polarizer 140 arranged at a light incident side of the array substrate 121. The array substrate 121 is arranged at a light-emitting side of the display panel 110. The deflection control of the liquid crystal 123 is achieved through the array substrate 121 provided with the pixel electrodes as well as the cover plate 122 provided with the common electrode 1220, so that a grating effect is achieved.

Here, the lower polarizer 140 is arranged at a side of the array substrate 121 backing to the cover plate 122. In other implementations, the liquid crystal grating 120 further includes an upper polarizer arranged on a surface of the cover plate 122 backing to the array substrate 121.

Alternatively, the pixel electrode may be made of a transparent conductive material, for example, an ITO (Indium Tin Oxide) thin film electrode or an IZO (Indium Zinc Oxide) thin film electrode.

Alternatively, the common electrode 1220 may be a metal film layer or a metal oxide film layer. For example, the common electrode 1220 may be an aluminum (Al) electrode, a copper (Cu) electrode, a molybdenum (Mo) electrode, a nickel (Ti) electrode or a chromium (Cr) electrode, or the above ITO electrode or 170 electrode.

Of course, a spacer for ensuring the thickness of a box as well as a frame sealing glue for sealing may be further arranged between the array substrate and the cover plate of the liquid crystal grating 120, which are not repeated herein.

As shown in FIG. 4, in addition to the foregoing pixel electrodes, the array substrate 121 usually further includes a first base substrate 1211, a first thin film transistor switch 1212, a first signal line 1213 (including but not limited to a gate line, a data line, and a common line), an insulating structure layer (not shown in the FIG.), and the like. As the array substrate 121 is arranged at the light-emitting side of the display panel 110, the first base substrate 1211 can further be used as a cover plate of the display panel 110. That is, the first substrate 1211 is reused as the cover plate of the display panel 110, so that the thickness of the display is reduced.

Alternatively, the first base substrate 1211 is usually a transparent substrate, and may be a glass substrate, a plastic substrate, a silicon substrate, or the like.

Alternatively, the first thin film transistor switch 1212 may be a top gate thin film transistor or a bottom gate thin film transistor.

Taking the top gate thin film transistor as an example, the structure of the top gate thin film transistor may include a buffer layer, an active layer, a gate insulating layer, a gate layer, an intermediate insulating layer, a source and drain layer, a flat layer, and the like which are stacked on the first base substrate 1211. Of course, the above thin film transistor may further include more or less film layers as long as it has the corresponding functions of the thin film transistor.

Alternatively, the gate layer and the source and drain layer may be metal layers such as an Al metal layer, a Cu metal layer, a Mo metal layer, a Ti metal layer, a Cr metal layer, or the like.

In the embodiment of the present disclosure, the liquid crystal grating 120 may adopt a TN (Twisted Nematic) type liquid crystal mode, so that the deflection of the liquid crystal can realize the function of the grating.

As shown in FIG. 4, the display panel 110 includes a second base substrate 111, a second thin film transistor switch 112, an anode 113, a second signal line 114 (including but not limited to a gate line, a data line, a common line, and the like), a pixel define layer 115, an organic light-emitting layer 116, a cathode 117, and the like.

Alternatively, the second base substrate 111 may be a glass substrate, a plastic substrate, a silicon substrate, or the like.

Alternatively, the second thin film transistor switch 112 may be a top gate thin film transistor or a bottom gate thin film transistor.

Taking the top gate thin film transistor as an example, the structure of the top gate thin film transistor may include a buffer layer, an active layer, a gate insulating layer, a gate layer, an intermediate insulating layer, a source and drain layer, a flat layer, and the like which are stacked on the first base substrate 1211. Of course, the above thin film transistor may further include more or less film layers as long as it has the corresponding functions of the thin film transistor.

Alternatively, the anode 113 may include an ITO wiring layer, a silver (Ag) reflective layer and an ITO electrode layer which are sequentially arranged on the secondary base substrate 111.

Alternatively, the ITO wiring layer and the ITO electrode layer may be replaced with an IZO wiring layer, an IZO electrode layer, or the like.

Exemplarily, the pixel define layer 115 includes a plurality of pixel define units spaced apart from each other at an interval. The pixel define units correspond to the anodes 113 one to one. Each pixel define units defines a light-emitting region on the corresponding anode 113; and an organic light-emitting layer 116 is located in the light-emitting region.

In the embodiment of the present disclosure, the organic light-emitting layer 116 includes, but is not limited to, a hole injection sub-layer, a hole transport sub-layer, an organic light-emitting sub-layer, an electron transport sub-layer, and an electron injection sub-layer which are sequentially arranged.

Here, the organic light-emitting sub-layer may include a red organic light-emitting sub-layer, a green organic light-emitting sub-layer, and a blue organic light-emitting sub-layer.

Alternatively, the cathode 117 may be made of a material such as silver, silver magnesium (Mg) alloy, or the like.

In the embodiment of the present disclosure, the above insulating layers (including the buffer layer, the gate insulating layer, the intermediate insulating layer, the flat layer, the pixel defining layer, and the like) may be silicon nitride layers or silicon oxynitride layers.

Of course, some film layers of the above insulating layers, such as the flat layer and the pixel define layer, may also be made of an organic material. For example, at least one of polyimide (PI), polyamide (PA), acrylic resin, benzocyclobutene (BCB), and phenol resin is adopted to fabricate the above insulating layers.

In this implementation, the touch control substrate 200 is arranged at a side of the cover plate 122 backing to the array substrate 121 and adopts the cover plate 122 as the base substrate 200A of the touch control substrate 200. That is, the cover plate 122 is reused as the base substrate 200A of the touch control substrate 200. A transparent sealing layer 220 is arranged on the touch control substrate 200. As the touch control substrate 200 is arranged at the side of the cover plate 122 backing to the array substrate 121, the user can feel the hardness or thickness change of the sensing structure 212 more easily.

Alternatively, the transparent sealing layer 220 may be a transparent insulating layer, such as a silicon nitride layer, a resin layer, or the like, so as to achieve a protection function while increasing a light transmissivity.

Figure 6:
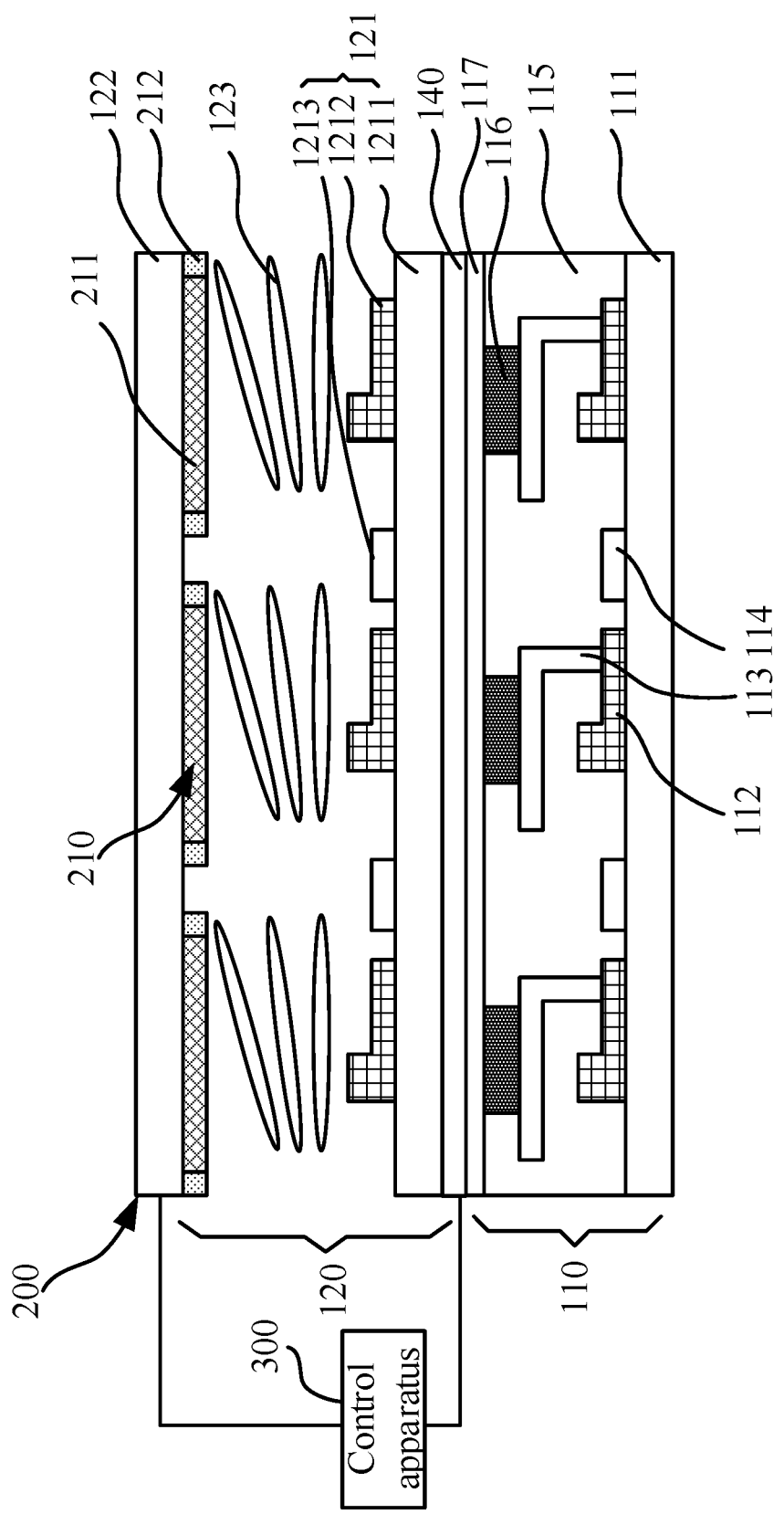
FIG. 6 is a schematically structural view of another display screen according to an embodiment of the present disclosure.

FIG. 6 is a schematically structural view of another display screen according to an embodiment of the present disclosure. Referring to FIG. 6, the display screen provided in FIG. 6 differs from the display screen provided in FIG. 4 in that the touch control unit 210 is arranged at a side of the cover plate 122 facing the array substrate 121. That is, the touch control unit 210 and the cover 122 constitute the touch control substrate 200. Exemplarily, the touch control substrate 200 uses the cover plate 122 as a base substrate 200A of the touch control substrate 200. That is, the cover plate 122 is reused as the base substrate 200A of the touch control substrate 200. A plurality of touch control units 210 is arranged at a side of the cover plate 122 facing the array substrate 121. The cover plate 122 has a thickness of 50-100 microns. The touch control substrate 200 is arranged on the internal side of the cover plate 122 to meet a touch control requirement. In this case, the cover plate 122 needs to be designed to be thinner, such as 50-100 microns. In this way, the user can feel the hardness or thickness change of the sensing structure 212.

As shown in FIG. 6, in an implementation, the touch control electrodes 211 in the plurality of touch control units 210 are reused as the common electrodes 1220. As the touch control electrodes 211 are reused as the common electrodes 1220, the material consumption is reduced; and meanwhile, the overall thickness of the touch screen is reduced. Exemplarily, a display screen with a refresh rate of 60 Hz is taken as an example, wherein it takes one frame 16.7 ms, which is divided into three stages. In the first stage, the touch control electrodes 211 are used as the common electrodes for display, which takes 11.7 to 12.7 ms. In the second stage, the touch control electrodes 211 are configured for touch control, and to determine whether each touch control electrode 211 is touched, which takes 2 to 3 ms. In the third stage, the touched touch control electrode 211 is configured to transmit voltage to the sensing structure to change the hardness or thickness thereof, which takes 2 to 3 ms.

Here, in order to avoid the display screen being excessively thick, there is no need to provide a sensing electrode to the touch control electrode 211. That is, a self-capacitor may also be adopted for the touch control solution.

Exemplarily, the touch control electrode 211 of each touch control unit 210 is connected to a touch control chip. In the second stage, the touch control chip applies a first driving signal to each touch control electrode 211, and then receives a feedback signal of each touch control electrode 211. Whether each touch control electrode 211 is touched is determined according to the feedback signal of each touch control electrode 211 to realize the touch control function. The first driving signal may be a pulse signal and the peak voltage of the pulse signal may be 3 to 5 V.

In the third stage, the touch control chip applies a second driving signal to the touched touch control electrode 211. The second driving signal is transmitted to the corresponding sensing structure through the touched touch control electrode to change the hardness or thickness of the sensing structure. In addition, in the third stage, the untouched touch control electrode 211 does not need to exert the second driving signal.

Of course, in other implementations, the plurality of touch control units 210 may also be arranged between the common electrode and the cover plate, and the touch control unit 210 and the common electrode are separated from each other with an insulating layer.

The insulating layer may be a silicon nitride layer or a silicon oxynitride layer. The insulating layer may also be made of an organic material. For example, the insulating layer may be made of at least one of polyimide (PI), polyamide (PA), acrylic resin, benzocyclobutene (BCB), and phenol resin.

In the embodiment of the present disclosure, the control apparatus 300 is configured to control the display panel 110 to operate in a set grayscale; and control the deflection of the liquid crystal 123 in the liquid crystal grating 120 to control the grayscale of each pixel of the display screen 100. Exemplarily, the control apparatus 300 controls the display panel 110 to operate in the same grayscale and controls a deflection voltage of the liquid crystal 123 that each pixel in the liquid crystal grating 120 corresponds to to realize a deflection angle of the liquid crystal 123 that each pixel corresponds to.

Since the liquid crystal grating 120 is designed on the display panel 110, the grating 120 not only can be used as a 3D display grating but also can adjust the grayscale of each pixel, so that the display panel 110 can always be operated in the set grayscale. The grayscale control of the display screen 100 can be achieved by controlling the liquid crystal grating 120. As the display panel 110 does not need to perform grayscale control, the display life span of the display panel 110 can be extended. Thus, problems of short life span and poor dependence of the OLED are solved.

Further, the control apparatus 300 can also be used as a control unit in the touch control substrate, so that a circuit structure of the display screen is simpler.

Embodiments of the present disclosure further provide an electronic device including the above touch screen.

The electronic device provided by the embodiments of the present disclosure may be any product or component having a display function, such as a mobile phone, a tablet computer, a television, a display, a notebook computer, a digital photo frame, a navigator, and the like.

In the present disclosure, the touch control substrate includes a sensing structure in addition to the touch control electrode. The hardness of the sensing structure changes in a process that the touch control unit is touched by the user, so that the user can feel the change in the hardness or thickness of a button when he/she touches the button. This change in hardness or thickness enriches the user's tactile sense when the user presses the button compared with a common touch control screen, so that the user's input hand-feel is improved.

Figure 7:
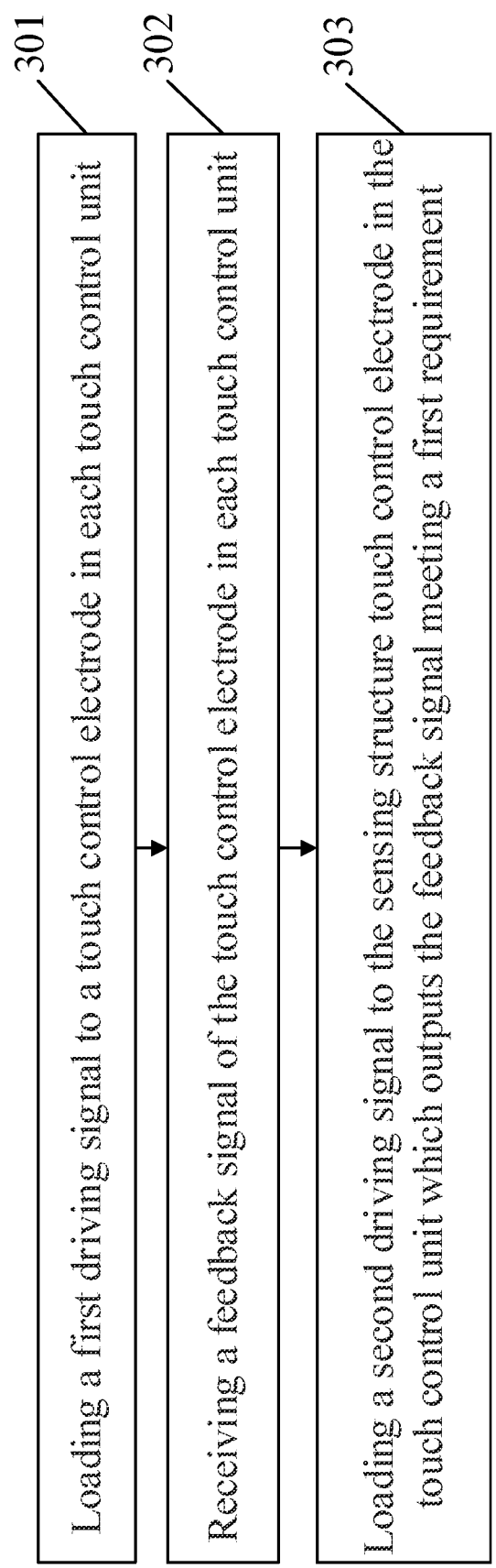
FIG. 7 is a flow chart of a touch control method according to an embodiment of the present disclosure.

FIG. 7 is a flow chart of a touch control method according to an embodiment of the present disclosure. The touch control method is implemented based on the touch screen provided in FIGS. 3-6.

Referring to FIG. 7, the method includes the following steps. In step 301, a first driving signal is loaded to a touch control electrode in each touch control unit.

Exemplarily, the first driving signal may be a pulse signal whose peak voltage may be 3 to 5V. The first driving signal is configured to achieve a touch control function of the touch screen.

In step 302, a feedback signal of the touch control electrode in each touch control unit is received. The feedback signal of the touch control electrode in the touch control unit may indicate whether the touch control electrode in each touch control unit is touched or not. For example, when the feedback signal generated by the first touch control electrode meets the first requirement, it indicates that the touch control electrode in the first touch control unit is touched.

Exemplarily, the capacitance of the touch control electrode changes when the touch control electrode is touched by the user, so that an electrical signal of the touch control electrode changes, and thus, a feedback signal of the touched touch control electrode is different from that of other touch control electrodes. Therefore, the touch control chip can determine whether each touch control electrode is touched according to the feedback signal thereof.

In step 303, a second driving signal is loaded to the sensing structure in the touch control unit which outputs the feedback signal meeting the first requirement. The second driving signal is used to drive tactility change of the sensing structure in the touch control unit.

The tactility change of the sensing structure in the touched touch control unit means that the hardness of the sensing structure changes under the exertion of the second driving signal, or the thickness of the sensing structure in the direction perpendicular to the base substrate changes under the exertion of the second driving signal.

Exemplarily, the voltage of the second driving signal is 5 to 15 V; and the second driving signal is configured to change the hardness of the sensing structure or the thickness of the sensing structure in the direction perpendicular to the base substrate.

For the touch control units which do not output feedback signals meeting the first requirement, there is no need to load the second driving signals to the sensing structures in those touch control units.

Here, the first requirement may be that the voltage of the feedback signal is within a voltage range.

Alternatively, the touch control electrode can be reused as a common electrode. A display screen with a refresh rate of 60 Hz is taken as an example, wherein it takes one frame 16.7 ms, which is divided into three stages, namely a first stage as a display stage, and a second stage and a third stage as the touch control stages. In the first stage, the touch control electrode is used as a common electrode for display, which takes 11.7 to 12.7 ms. That is, the method includes: loading a common electrode driving signal to the touch control electrode in each touch control unit in the display stage. In the second stage, the touch control electrode is used for touch control, which takes 2 to 3 ms. In the second stage, the touch control chip loads a first driving signal to each touch control electrode, receives a feedback signal of each touch control electrode, and determines whether each touch control electrode is touched according to the feedback signal of the touch control electrode. In the third stage, the touched touch control electrode is configured to transmit voltage that can change the hardness or thickness of the sensing structure to the sensing structure, which takes 2 to 3 ms. In the third stage, the touch control chip applies a second driving signal to the touched touch control electrode, and the touch control electrode is electrically connected to the sensing structure. Thus, the second driving signal is transmitted to the corresponding sensing structure through the touched touch control electrode to change the hardness or thickness of the sensing structure. In addition, in the third stage, the untouched touch control electrode does not need to exert the second driving signal.

In the embodiment of the present disclosure, first, touch positioning is achieved by loading the first driving signal; and then, the second driving signal is loaded to the sensing structure that is positioned by touching. Thus, the hardness of the sensing structure changes in a process that the touch control unit is touched by the user, so that the user can feel the change in the hardness or thickness of a button when he/she touches the button. This change in hardness or thickness enriches the user's tactile sense when the user presses the button compared with a common touch control screen, so that the user's input hand-feel is improved.

The foregoing descriptions are only exemplary embodiments of the present disclosure and not intended to limit the present disclosure. Within the spirit and principles of the disclosure, any modifications, equivalent substitutions, improvements, etc., are within the protection scope of the appended claims of the present disclosure.

What is claimed is:

1. A touch control substrate, comprising: a base substrate, and a plurality of touch control units on the base substrate in an array, wherein each touch control unit comprises a touch control electrode and a sensing structure, a hole is provided in the middle of the sensing structure at a side of the sensing structure backing to the base substrate, the touch control electrode in each touch control unit is in the hole of the corresponding sensing structure, and the corresponding sensing structure is arranged around the touch control electrode; the tactility change of the sensing structure comprises one of the following two cases: a hardness change, and a thickness change in a direction perpendicular to the base substrate; the sensing structure is made of an N-isopropyl acrylamide material and the hardness of the sensing structure changes under the exertion of voltage;

the touch control electrode loads a first driving signal and generates a feedback signal under the exertion of the first driving signal; and the sensing structure is configured to load a second driving signal if a feedback signal generated by the touch control electrode in the same touch control unit meets a first requirement, wherein the second driving signal is used to drive tactility change of the sensing structure.

2. The touch control substrate of claim 1, wherein the sensing structure is made of an electrostrictive material and the thickness of the sensing structure in a direction perpendicular to the base substrate changes under the exertion of voltage.

3. A touch screen, comprising a display screen and a touch control substrate on the display screen, wherein the touch control substrate comprises a base substrate, and a plurality of touch control units on the base substrate in an array; each touch control unit comprises a touch control electrode and a sensing structure, a hole is provided in the middle of the sensing structure at a side of the sensing structure backing to the base substrate, the touch control electrode in each touch control unit is in the hole of the corresponding sensing structure, and the corresponding sensing structure is arranged around the touch control electrode, the tactility change of the sensing structure comprises one of the following two cases: a hardness change, and a thickness change in a direction perpendicular to the base substrate; the sensing structure is made of an N-isopropyl acrylamide material and the hardness of the sensing structure changes under the exertion of voltage;

the touch control electrode loads a first driving signal and generates a feedback signal under the exertion of the first driving signal; and the sensing structure is configured to load a second driving signal if a feedback signal generated by the touch control electrode in the same touch control unit meets a first requirement, wherein the second driving signal is used to drive tactility change of the sensing structure.

4. The touch screen of claim 3, wherein the sensing structure is made of an electrostrictive material, and the thickness of the sensing structure in a direction perpendicular to the base substrate changes under the exertion of voltage.

5. The touch screen of claim 3, wherein the display screen comprises a display panel, a liquid crystal grating on the display panel, and a control apparatus for controlling the operation of the display panel and the liquid crystal grating; wherein the control apparatus is configured to control the display panel to generate an image and control the deflection of a liquid crystal in the liquid crystal grating.

6. The touch screen of claim 5, wherein the liquid crystal grating comprises an array substrate with a pixel electrode, a cover plate with a common electrode, a liquid crystal between the array substrate and the cover plate, and a lower polarizer on a light incident side of the array substrate; and the array substrate is on a light-emitting side of the display panel.

7. The touch screen of claim 6, wherein the cover plate is reused as a base substrate of the touch control substrate, and the plurality of touch control units is on a side of the cover plate facing the array substrate.

8. The touch screen of claim 7, wherein the touch control electrodes in the plurality of touch control units are reused as the common electrodes.

9. The touch screen of claim 6, wherein the touch control substrate is on a side of the cover plate backing to the array substrate and the cover plate is reused as the base substrate of the touch control substrate.

10. The touch screen of claim 5, wherein the display panel is an organic light-emitting diode panel.

11. An electronic device, comprising the touch screen of claim 3.

12. A touch control method implemented based on a touch screen, wherein the touch screen comprises a display screen and a touch control substrate on the display screen, the touch control substrate comprises a base substrate, and a plurality of touch control units on the base substrate in an array; each touch control unit comprises a touch control electrode and a sensing structure, a hole is provided in the middle of the sensing structure at a side of the sensing structure backing to the base substrate, the touch control electrode in each touch control unit is in the hole of the corresponding sensing structure, and the corresponding sensing structure is arranged around the touch control electrode, the tactility change of the sensing structure comprises one of the following two cases: a hardness change, and a thickness change in a direction perpendicular to the base substrate; the sensing structure is made of an N-isopropyl acrylamide material and the hardness of the sensing structure changes under the exertion of voltage;

the method comprising:
loading a first driving signal to a touch control electrode in each touch control unit;
receiving a feedback signal of the touch control electrode in each touch control unit;
loading a second driving signal to the sensing structure in the touch control unit which outputs the feedback signal meeting a first requirement, wherein the second driving signal is used to drive tactility change of the sensing structure.

13. The touch control substrate of claim 1, wherein the touch control electrode is electrically connected to the sensing structure and configured to provide the second driving signal if the feedback signal generated meets the first requirement.

14. The touch screen of claim 3, wherein the touch control electrode is electrically connected to the sensing structure and configured to provide the second driving signal if the feedback signal generated meets the first requirement.

* * * * *